United States Patent [19]

Park

[11] Patent Number: 5,759,914

[45] Date of Patent: Jun. 2, 1998

[54] METHOD FOR FORMING INTERCONNECTION IN SEMICONDUCTOR DEVICE

[75] Inventor: Sang-Hoon Park, Ich'on, Rep. of Korea

[73] Assignee: Hyundai Electronics Industries Co., Ltd., Ich'on, Rep. of Korea

[21] Appl. No.: 762,028

[22] Filed: Dec. 11, 1996

[30] Foreign Application Priority Data

Dec. 30, 1995 [KR] Rep. of Korea .................. 95 69499

[51] Int. Cl.[6] .................. H01L 21/283; H01L 21/32
[52] U.S. Cl. .................. 438/624; 438/626; 438/637; 438/648
[58] Field of Search .................. 437/189, 190, 437/192, 195; 438/624, 626, 627, 629, 637, 648, 656

[56] References Cited

U.S. PATENT DOCUMENTS 5,141,896  8/1992  Katoh .................. 437/195
5,169,802  12/1992  Yeh .................. 437/195

OTHER PUBLICATIONS

Kaanta, C., et al., "Dual Damascene: A ULSI Wiring Technology", Jun. 11-12, 1991 VMIC Conf., pp. 144-152, Jun. 1991.

*Primary Examiner*—T. N. Quach
*Attorney, Agent, or Firm*—Ware, Fressola, Van Der Sluys & Adolphson LLP

[57] ABSTRACT

A method for forming an interconnection in semiconductor device is disclosed wherein there is first provided a semiconductor substrate where a first metal interconnection is formed thereon. A first insulating layer is formed on the semiconductor substrate. Thereafter, a plurality of second insulating layer patterns is formed on the first insulating layer. Afterwards, spaces between the plurality of the second insulating layer patterns are filled with a first metal. Thereafter, the second insulating layer patterns over respective patterns of the first metal interconnection and the overlying first insulating layer are etched to form a plurality of contact holes. The plurality of contact holes is filled with a second metal. Lastly, a second metal interconnection is formed.

26 Claims, 4 Drawing Sheets

METHOD FOR FORMING INTERCONNECTION IN SEMICONDUCTOR DEVICE

BACKGROUND OF THE INVENTION

1. Field of the Invention

The present invention generally relates to a method for fabricating a semiconductor device, and more particularly, to a method for forming an interconnection to connect a lower conducting region with an upper interconnection.

2. Description of the Related Art

As semiconductor devices become more highly integrated together with a steep development in semiconductor technology, finer patterns used in their manufacture are required. In order to satisfy this requirement, an effort for minimizing the process margin must also be made when designing a layout of a semiconductor circuit.

However, on fabricating a semiconductor device with an ultra fine pattern according to the designed circuit, engineers are confronted with various difficulties for finding an adequate method to align respective contact holes and interconnections. Especially, in the case for an exposure apparatus, which is one of several for fabricating a semiconductor device with an ultra fine pattern, it is very difficult to re-align respective patterns without generating an error in the dimensions of the semiconductor device during the production process. FIG. 1 is a simplified sectional view of a semiconductor device with an upper interconnection coupled electrically with a lower interconnection according to the conventional art.

Referring to FIG. 1, there is provided a semiconductor substrate 1 where an intermetallic insulating layer 2 with a selected thickness, a lower interconnection 3, an oxide layer 4 for the planarization are respectively formed thereon. In order to electrically connect the lower interconnection with an upper interconnection 6 that is formed, contact holes are formed in selected portions of the oxide layer 4 for planarization. Afterwards, the contacts holes are filled with a metal such as tungsten, thereby forming plugs 5. Thereafter, the upper interconnection 6 is formed for the contact with the plugs 5.

The conventional method, however, for forming an interconnection has a shortcoming in that the lower interconnection is not electrically connected with the upper interconnection because, when an alignment failure occurs during the fabrication of a mask for the upper interconnection, the upper interconnection 6 is not electrically connected with the plug 5. As a result, yield in fabricating the device is decreased.

SUMMARY OF THE INVENTION

Accordingly, it is an object of this invention to provide a method for forming an interconnection in a semiconductor device capable of preventing electrical failure such as open failure between interconnections by applying a dummy pattern.

According to the present invention, a method for forming an interconnection in a semiconductor device, comprises the steps of: (a) providing a semiconductor substrate where a first insulating layer is formed on an entire surface of the semiconductor substrate; (b) forming a first metal layer and patterning the first metal layer to form a lower metal interconnection on the first insulating layer; (c) forming a second insulating layer on the surface of the first insulating layer and the patterned lower metal interconnection, to a thickness sufficient to cover a top surface of the lower metal interconnection; (d) forming a third insulating layer on the entire surface of the second insulating layer wherein the third insulating layer has a different etch rate from the second insulating layer; (e) patterning the third insulating layer to form third insulating patterns such that some of the third insulating layer patterns are formed on the second insulating layer overlying the lower metal interconnection and others of the third insulating layer patterns are formed on the second insulating layer between one pattern and an adjacent pattern thereto of the lower metal interconnection, the third insulating layer patterns being spaced from each other; (f) filling the spaces between the third insulating layer patterns with a first filling metal to form a first filling metal layer; forming a photoresist mask pattern such that the third insulating layer patterns formed on the second insulating layer overlying the lower metal interconnection are exposed; (g) removing the exposed third insulating layer patterns and the second insulating layer underlying the exposed third insulating layer patterns by anisotropic etching until a top surface of the lower metal interconnection are exposed, thereby to form a plurality of contact holes; (h) filling the plurality of contact holes with a second filling metal thereby to form the plurality of plugs; forming a third metal layer on the surface of the resultant structure; and (i) patterning the third metal layer to form an upper metal interconnection such that the upper metal interconnection makes electrical connection with the lower metal interconnection.

BRIEF DESCRIPTION OF THE DRAWINGS

Further objects and advantages of the present invention will be apparent from the following description, reference being had to the accompanying drawings wherein a preferred embodiment of the present invention is clearly shown.

In the drawings.

DETAILED DESCRIPTION OF THE INVENTION

Hereinbelow, there will be described one embodiment of the present invention with reference to the enclosed drawings.

FIGS. 2A–2G are simplified sectional views of a semiconductor device for describing a method for forming a contact hole according to one embodiment of the present invention.

Figure 1:
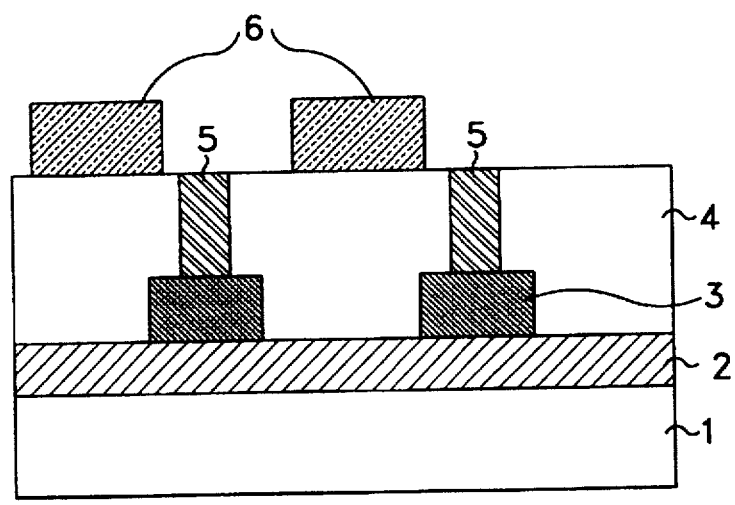
FIG. 1 is a simplified sectional view of a semiconductor device according to the conventional art.
Figure 2A:
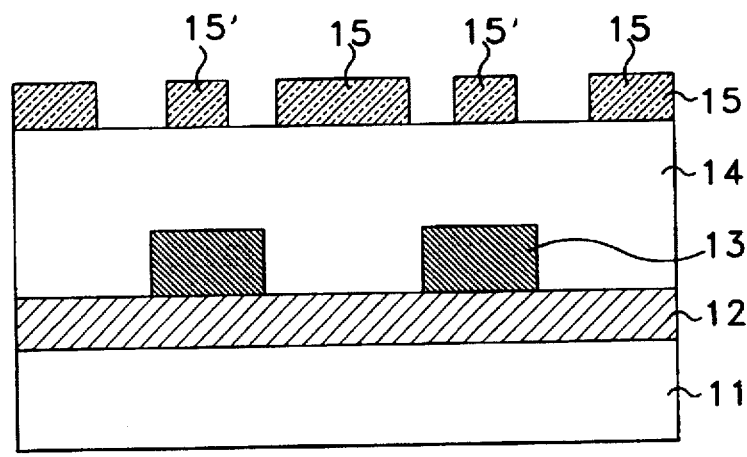
FIGS. 2A–2G are simplified sectional views for describing a method for forming an interconnection according to one embodiment of the present invention.

Referring to FIG. 2A, a semiconductor substrate 11 of single crystal silicon where a first intermetallic insulating layer 12 is formed at a selected thickness thereon, is provided. A first metal layer is formed at a selected thickness on the first insulating layer 12 and patterning of the formed first metal layer is performed, whereby a lower metal interconnection 13 is formed. Afterwards, a second insulating layer 14 is formed on the lower metal interconnection 13 and the first insulating layer 12. The second insulating layer 14 is planarized so as to improve the topology of the top surface of the second insulating layer 14. One or more is selected from a group consisting of borophosphosilicate glass (BPSG), phosphosilicate glass (PSG), borosilicate glass (BSG), and spin on glass (SOG) as the second insulating layer.

Thereafter, a nitride as a third insulating layer layer is deposited at a thickness of 300–800 A on the second insulating layer 14 and is patterned by a photolithography method, whereby a plurality of nitride layer patterns 15 and 15' with a distance between two patterns is formed. Among the nitride patterns, some of the nitride layer patterns 15' are formed on a top surface of the second insulating layer 14 overlying the lower metal interconnection pattern 13 and the others of the nitride layer patterns 15 are formed on a top surface of the second insulating layer 14 overlying a gap between one pattern and an adjacent pattern thereto of the lower metal interconnection pattern 13. The nitride layer patterns 15 and 15' are spaced from each other. A distance between the nitride layer patterns 15 and 15' is 0.05–0.2 μm.

Figure 2B:
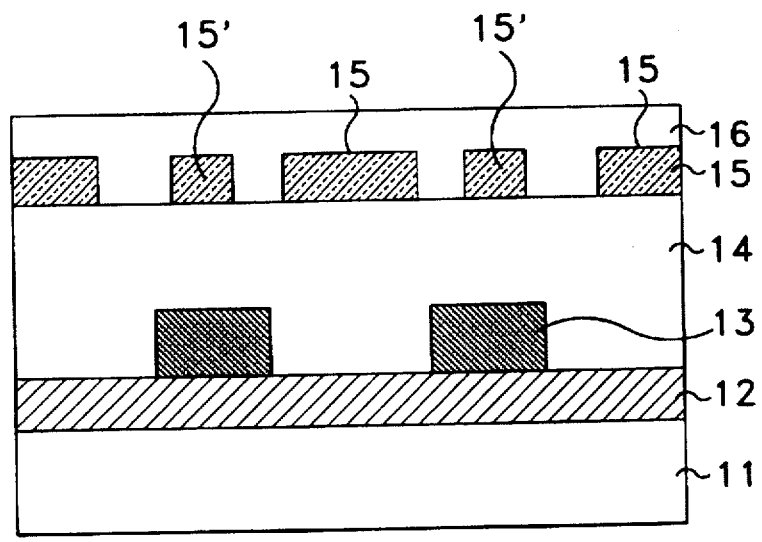

Referring to FIG. 2B, a first filling metal layer 16 which is selected from transition metal group such as tungsten (W), titanium (Ti), tantalum (Ta) and molybdenum (Mo) is formed at a thickness of 500–1,000 Å to a degree sufficient to fill the spaces between the nitride layer patterns 15 and 15'.

Figure 2C:
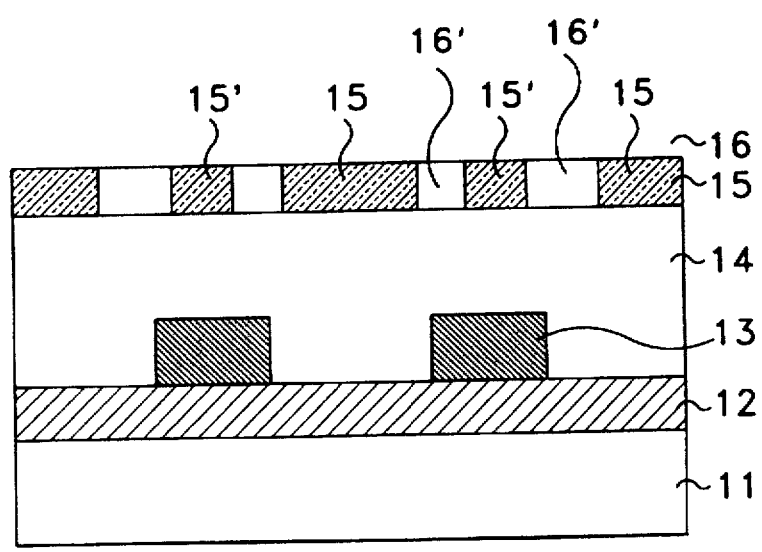

Referring to FIG. 2C, the first filling metal layer 16 is etched back until the surface of the nitride layer patterns 15 and 15' is exposed, thereby forming a dummy pattern 16'. A Chemical mechanical polishing (CMP) method may be used for exposing the nitride layer pattern 15 and 15'.

Figure 2D:
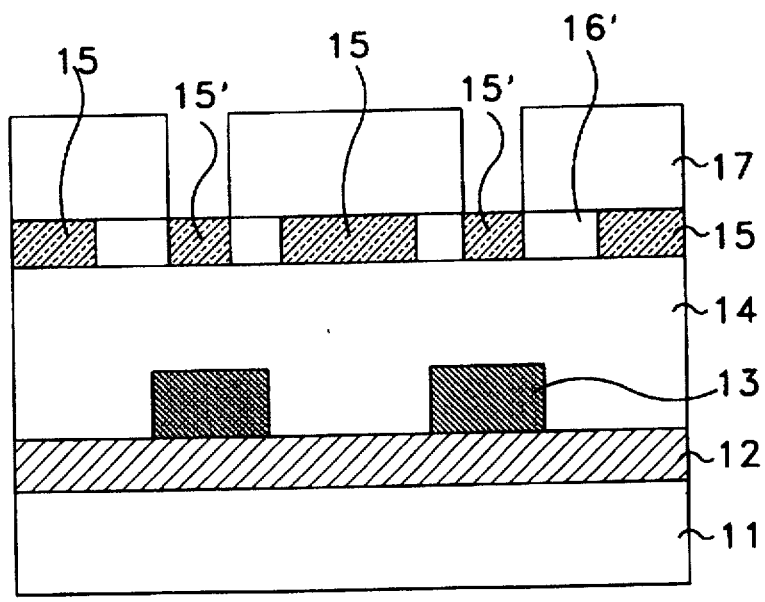

Referring to FIG. 2D, a photoresist mask pattern 17 is formed on the dummy patterns 16' and the nitride layer patterns 15. The exposed nitride patterns 15' and the underlying second insulating layer 14 are removed in sequence by an anisotropic etching method, thereby forming contact holes 18 and exposing the lower metal interconnection layer 13 as shown in FIG. 2E.

Figure 2E:
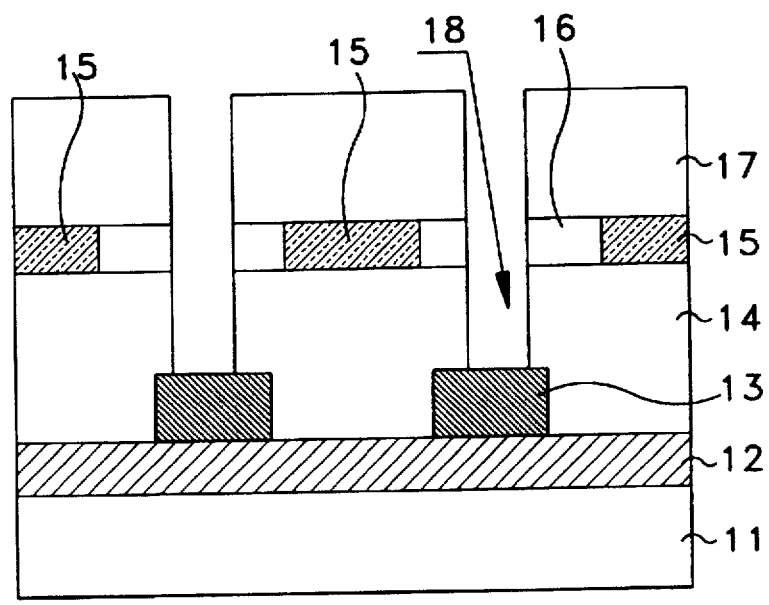
Figure 2F:
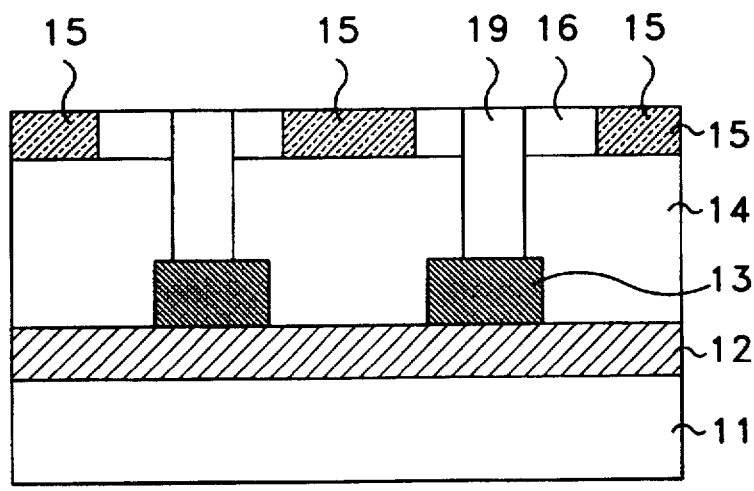

Referring to FIG. 2F, after the photoresist mask pattern 17 as shown in FIG. 2E is removed, tungsten as a second filling metal is deposited such that the contact holes 18 are sufficiently filled with tungsten. Thereafter, the deposited tungsten is etched back until the surface of the nitride layer patterns 15 and 15' and the surface of the dummy patterns 16', are exposed, thereby forming tungsten plugs 19. Chemical mechanical polishing (CMP) may be also used for the formation of the tungsten plugs 19.

In addition, in order to enhance the adhesive force with the second insulating layer 14 and to prevent the creation of voids in the formed tungsten plug, three layers having a stacked structure of a titanium layer, a titanium nitride layer, and a tungsten layer, can be also substituted for the single tungsten plugs. At this time, the titanium layer is about 200–400 Å thick, the titanium nitride layer is about 500–700 Å thick, and the tungsten layer is about 6000–8000 Å thick. It is preferable that the titanium layer is about 300 Å thick, the titanium nitride layer is about 600 Å thick, and the tungsten layer is about 7000 Å thick.

Thereafter, a third metal layer is formed on the surface of the resultant structure. The third metal layer is then patterned to form an upper metal interconnection pattern 20 such that patterns of the upper metal interconnection pattern 20 make electrical connection with the lower metal interconnection pattern 13.

Figure 2G:
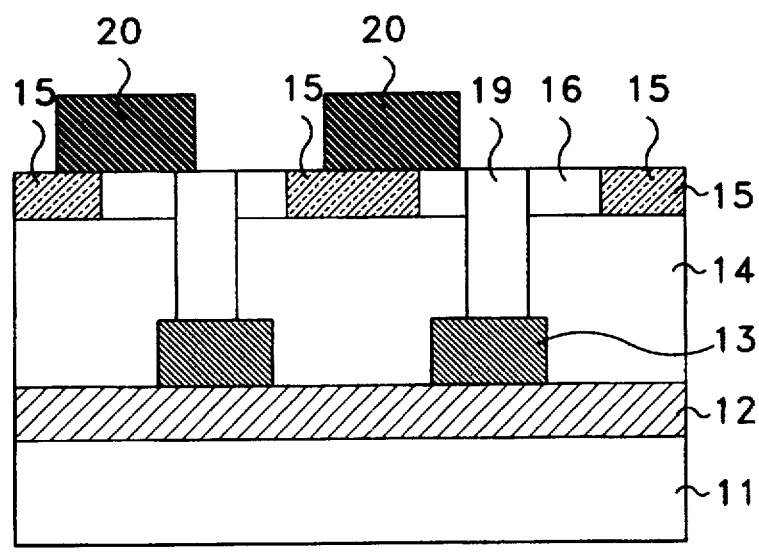

Even though, on account of a misalignment, patterns of the upper metal interconnection pattern 20 may not be formed at selected positions directly over the patterns of the lower metal interconnection pattern, as shown, there is no problem in the operation of the device, because patterns of the lower metal interconnection pattern 13 and the upper metal interconnection pattern 20 are electrically connected by the dummy patterns 16', as shown in FIG. 2G and according to the present invention.

As described previously, the method according to the present invention prevents an open-circuit type failure in the electrical connection between a lower interconnection and an upper interconnection that would otherwise be caused by the above-described misalignment and which is prevented by forming dummy patterns around contact holes. As a result, the present invention provides an effect to enhance yield.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming an interconnection in a semiconductor device, comprising the steps of:

forming a first insulating layer on a surface of a semiconductor substrates forming a first metal layer and patterning the first metal layer to form a lower metal interconnection pattern on the first insulating layer;

forming a second insulating layer on the first insulating layer and the patterned lower metal interconnection to an extent and thickness sufficient to cover a top surface of the lower metal interconnection pattern;

forming a third insulating layer on a surface of the second insulating layer wherein said third insulating layer has a different etch rate from the second insulating layer;

patterning the third insulating layer to form third insulating layer patterns such that some patterns of the third insulating patterns are formed on the second insulating layer overlying corresponding patterns of the lower metal interconnection pattern and other patterns of the third insulating layer patterns are formed on the second insulating layer overlying corresponding gaps between adjacent patterns of the lower metal interconnection pattern wherein patterns of said some patterns and said other patterns alternate on said second insulating layer with spaces therebetween;

filling said spaces between the third insulating layer patterns with a first filling metal to form a first filling metal layer;

forming a photoresist mask pattern such that the third insulating layer patterns formed on the second insulating layer overlying the lower metal interconnection pattern are exposed;

removing the exposed third insulating layer patterns and portions of the second insulating layer underlying the exposed third insulating layer patterns by anisotropic etching until a top surface of the lower metal interconnection pattern is exposed, thereby forming a plurality of contact holes;

filling the plurality of contact holes with a second filling metal thereby forming a plurality of contact plugs in a resultant structure;

forming a third metal layer on a surface of the resultant structure; and patterning the third metal layer to form an upper metal interconnection pattern such that patterns of the upper metal interconnection pattern make electrical contact with patterns of the lower metal interconnection pattern.

2. The method in accordance with claim 1, wherein the second insulating layer is one or more insulating materials selected from a group consisting of BPSG, PSG, BSG, and SOG.

3. The method in accordance with claim 1, wherein the third insulating layer is a nitride layer.

4. The method in accordance with claim 3, wherein the nitride layer is formed to a thickness of 300–800 Å.

5. The method in accordance with claim 1, wherein a distance between the plurality of the third insulating layer patterns is 0.05–0.2 μm.

6. The method in accordance with claim 1, wherein the first filling metal is selected from a group of transition metals consisting of tungsten, titanium, tantalum, and molybdenum.

7. The method in accordance with claim 6, wherein the first filling metal is formed to a thickness of 500–3,000 Å.

8. The method in accordance with claim 1, wherein the step of filling the spaces between the third insulating patterns with said first filling metal to form the first filling metal layer, comprises the steps of:

depositing the first filling metal at a selected thickness on a surface of the second insulating layer and the third insulating layer patterns; and etching back the deposited first filling metal until a top surface of the third insulating layer patterns is exposed, to form the first filling metal layer.

9. The method in accordance with claim 8, wherein the first filling metal layer is selected from a group of transition metals consisting of tungsten, titanium, tantalum, and molybdenum.

10. The method in accordance with claim 1, wherein the first filling metal layer is patterned by chemical mechanical polishing.

11. The method in accordance with claim 1, wherein the second filling metal is tungsten.

12. The method in accordance with claim 1, wherein the second filling metal has a stacked structure of three layers, a first, titanium layer having a thickness of 200–400 Å, a second, titanium nitride layer having a thickness of 500–700 Å, and a third, tungsten layer having a thickness of 6,000–8,000 Å.

13. The method in accordance with claim 12, wherein the titanium layer is about 300 Å thick, the titanium nitride layer is about 600 Å thick, and tungsten layer is about 7,000 Å thick.

14. A method for forming an interconnection in a semiconductor device, comprising the steps of:

providing a semiconductor substrate where a first insulating layer is formed on an entire surface of the semiconductor substrate;

forming a first metal layer and patterning the first metal layer to form a lower metal interconnection on the first insulating layer;

forming a second insulating layer on the surface of the first insulating layer and the patterned lower metal interconnection, to a thickness sufficient to cover a top surface of the lower metal interconnection;

forming a third insulating layer on the entire surface of the second insulating layer wherein the third insulating layer has a different etch rate from the second insulating layer;

patterning the third insulating layer to form third insulating patterns such that some of the third insulating layer patterns are formed on the second insulating layer overlying the lower metal interconnection and others of the third insulating layer patterns are formed on the second insulating layer between one pattern and an adjacent pattern thereto of the lower metal interconnection, the third insulating layer patterns being spaced from each other;

filling the spaces between the third insulating layer patterns with a first filling metal to form a first filling metal layer;

forming a photoresist mask pattern such that the third insulating layer patterns formed on the second insulating layer overlying the lower metal interconnection are exposed;

removing the exposed third insulating layer patterns and the second insulating layer underlying the exposed third insulating layer patterns by anisotropic etching until a top surface of the lower metal interconnection are exposed, thereby to form a plurality of contact holes;

filling the plurality of contact holes with a second filling metal thereby to form the plurality of plugs;

forming a third metal layer on the surface of the resultant structure; and patterning the third metal layer to form an upper metal interconnection such that the upper metal interconnection makes electrical connection with the lower metal interconnection.

15. The method in accordance with claim 14, wherein the second insulating layer is one or more insulating materials selected from a group consisting of BPSG, PSG, BSG, and SOG.

16. The method in accordance with claim 14, wherein the third insulating layer is a nitride layer.

17. The method in accordance with claim 16, wherein the nitride layer is formed to a thickness of 300–800 Å.

18. The method in accordance with claim 14, wherein a distance between the plurality of the third insulating layer patterns is 0.05–0.2 μm.

19. The method in accordance with claim 14, wherein the first filling metal is selected from a group of transition metals consisting of tungsten, titanium, tantalum and molybdenum.

20. The method in accordance with claim 14, wherein the first filling metal layer is formed to a thickness of 500–3000 Å.

21. The method in accordance with claim 14, wherein the step of filling the spaces between the third insulating layer patterns with the first filling metal to form the first filling metal layer comprises the steps of:

depositing the first filling metal at a selected thickness on a surface of the second insulating layer and the third insulating layer patterns; and etching back the deposited first filling metal until top surfaces of the third insulating layer patterns are exposed, to form the first filling metal layer.

22. The method in accordance with claim 21, wherein the first filling metal layer is selected from a group of transition metals consisting of tungsten, titanium, tantalum and molybdenum.

23. The method in accordance with claim 14, wherein the first filling metal layer is patterned by chemical and mechanical polishing.

24. The method in accordance with claim 14, wherein the second filling metal is tungsten.

25. The method in accordance with claim 14, wherein the second filling metal has a stacked structure of three layers, a first layer being a titanium layer of a thickness of 200–400 Å, a second layer being a titanium nitride layer of a thickness of 500–700 Å, and a third layer being a tungsten layer of a thickness of 6000–8000 Å.

26. The method in accordance with claim 25, wherein the titanium layer is about 300 Å thick, the titanium nitride layer is about 600 Å thick, and the tungsten layer is about 7,000 Å thick.

* * * * *

UNITED STATES PATENT AND TRADEMARK OFFICE
CERTIFICATE OF CORRECTION

PATENT NO. : 5,759,914
DATED : June 2, 1998
INVENTOR(S) : PARK

It is certified that error appears in the above-identified patent and that said Letters Patent is hereby corrected as shown below:

Column 4, line 21 (claim 1, line 4) after "substrates"

insert --;-- and start a new paragraph.
      Abstract

[57] line 5 after "substrate" delete "," and insert --.--

Signed and Sealed this

Eighteenth Day of August, 1998

Attest:

BRUCE LEHMAN

Attesting Officer      Commissioner of Patents and Trademarks